(12) United States Patent
Fumitake

(10) Patent No.: US 8,114,732 B2
(45) Date of Patent: Feb. 14, 2012

(54) METHOD FOR MANUFACTURING TWIN BIT STRUCTURE CELL WITH $AL_2O_3$/NANO-CRYSTALLINE SI LAYER

(75) Inventor: Mieno Fumitake, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/704,502

(22) Filed: Feb. 11, 2010

(65) Prior Publication Data

US 2011/0045649 A1    Feb. 24, 2011

(30) Foreign Application Priority Data

Aug. 20, 2009  (CN) .......................... 2009 1 0056728

(51) Int. Cl.
- *H01L 21/336* (2006.01)
- *H01L 21/461* (2006.01)
- *H01L 21/8242* (2006.01)

(52) U.S. Cl. ........ 438/239; 438/254; 438/261; 438/288; 438/591; 438/723; 438/739; 257/E21.01; 257/E21.21; 257/E21.218; 257/E21.28; 257/E21.423; 257/E21.679

(58) Field of Classification Search .................. 438/239, 438/254, 261, 288, 591, 723, 739; 257/E21.01, 257/E21.21, E21.218, E21.28, E21.423, E21.679
See application file for complete search history.

(56) References Cited

U.S. PATENT DOCUMENTS

| | | | |
|---|---|---|---|
| 5,661,592 A * | 8/1997 | Bornstein et al. ............. | 359/291 |
| 6,018,178 A | 1/2000 | Sung | |
| 6,268,235 B1 * | 7/2001 | Sakakura et al. ................ | 438/62 |
| 6,884,734 B2 * | 4/2005 | Buehrer et al. ................ | 438/723 |
| 7,012,297 B2 * | 3/2006 | Bhattacharyya .............. | 257/317 |
| 7,518,912 B2 | 4/2009 | Hung et al. | |
| 7,589,368 B2 * | 9/2009 | Lee ................ | 257/296 |
| 7,666,739 B2 * | 2/2010 | Lee et al. ...................... | 438/260 |
| 7,723,789 B2 * | 5/2010 | Lin et al. ...................... | 257/349 |
| 7,851,285 B2 | 12/2010 | Park | |
| 2004/0021172 A1 * | 2/2004 | Zheng et al. ................... | 257/316 |
| 2004/0142528 A1 * | 7/2004 | Bhattacharyya .............. | 438/251 |

(Continued)

OTHER PUBLICATIONS

Non-Final Office Action for U.S. Appl. No. 12/978,346, mailed on Oct. 7, 2011, 13 pages.

*Primary Examiner* — Walter L Lindsay, Jr.
*Assistant Examiner* — Ron Pompey
(74) *Attorney, Agent, or Firm* — Kilpatrick Townsend and Stockton LLP

(57) ABSTRACT

A method and system for forming a non-volatile memory structure. The method includes providing a semiconductor substrate and forming a gate dielectric layer overlying a surface region of the semiconductor substrate. A polysilicon gate structure is formed overlying the gate dielectric layer. The method subjects the polysilicon gate structure to an oxidizing environment to cause formation of a first silicon oxide layer overlying the polysilicon gate structure and formation of an undercut region underneath the polysilicon gate structure. An aluminum oxide material is formed overlying the polysilicon gate structure filling the undercut region. In a specific embodiment, the aluminum oxide material has a nanocrystalline silicon material sandwiched between a first aluminum oxide layer and a second aluminum oxide layer. The aluminum oxide material is subjected to a selective etching process while maintaining the aluminum oxide material in an insert region in a portion of the undercut region. The method forms a sidewall structure overlying a side region of the polysilicon gate structure.

17 Claims, 8 Drawing Sheets

U.S. PATENT DOCUMENTS

| | | |
|---|---|---|
| 2008/0017954 A1 | 1/2008 | Suzuki et al. |
| 2008/0049517 A1 | 2/2008 | Hung et al. |
| 2008/0061359 A1* | 3/2008 | Lee et al. ............... 257/324 |
| 2008/0153222 A1* | 6/2008 | Lee et al. ............... 438/257 |
| 2009/0115318 A1* | 5/2009 | Gregory et al. ............ 313/504 |

* cited by examiner

Retention characteristics of Al2O3 storage layer.
Vg=Vd=Vs=Vd=0 V.

METHOD FOR MANUFACTURING TWIN BIT STRUCTURE CELL WITH AL$_2$O$_3$/NANO-CRYSTALLINE SI LAYER

CROSS-REFERENCES TO RELATED APPLICATIONS

This application claims priority to Chinese Application No. 200910056728.5 filed on Aug. 20, 2009 commonly assigned and is hereby incorporated by reference for all purposes. This application is also related to the following co-pending U.S. patent applications, all of which are commonly owned and are hereby incorporated by reference for all purpose: U.S. patent application Ser. No. 12/978,346, filed Dec. 23, 2010, U.S. patent application Ser. No. 12/978,473, filed Dec. 24, 2010, U.S. patent application Ser. No. 12/965,808, filed Dec. 10, 2010, U.S. patent application Ser. No. 12/968,264, filed Dec. 14, 2010, and U.S. patent application Ser. No. 12/969,563, filed Dec. 15, 2010.

BACKGROUND OF THE INVENTION

The present invention is directed to integrated circuits and their processing for the manufacture of semiconductor devices. More particularly, the invention provides a method and a device for forming a twin bit cell structure for semiconductor integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. An example of such limitation lies in manufacture of memory devices. As feature size continues to shrink, a twin bit cell structure becomes difficult to apply as it is difficult to control the gates independently.

One of the challenges in semiconductor has been the processing of manufacturing twin-bit cell structure for non-volatile memory devices, such as popular flash based memory devices. Among other things, the conventional system and method for manufacturing cells with twin-bit structures are limited when it is required to scaling down the cell size.

From the above, it is seen that an improved technique for manufacturing and device for twin bit cell structures.

BRIEF SUMMARY OF THE INVENTION

According to embodiments of the present invention, techniques directed to manufacturing memory devices are provided. More particularly, embodiments according to the present invention provide a method and a structure for manufacturing a twin bit cell structure for a non-volatile memory device. But it should be recognized that the present invention has a much broader range of applicability.

In a specific embodiment, a method for forming a non-volatile memory structure is provided. The method includes providing a semiconductor substrate including a surface region. A gate dielectric layer is formed overlying the surface region. The method forms a polysilicon gate structure overlying the gate dielectric layer. In a specific embodiment, the method subjects the gate polysilicon structure to an oxidizing environment to cause formation of a first silicon oxide layer overlying the gate polysilicon structure. Preferably, an undercut region is allowed to be formed underneath the gate polysilicon structure. The method includes forming an aluminum oxide material overlying the polysilicon gate structure including the undercut region and the gate dielectric layer. In a specific embodiment, the aluminum oxide material comprises a nanocrystalline silicon material sandwiched between a first aluminum oxide layer and a second aluminum oxide layer. The aluminum oxide material is subjected to a selective etching process to form an insert region in a portion of the undercut region while the insert region remains filled with the aluminum oxide material.

Many benefits are achieved by ways of the present invention over conventional techniques. For example, embodiments according to the present invention provide a method to form a reliable twin bit cell structure. According to a specific embodiment, a gate structure is formed on top of a dielectric layer, which is later selectively etched to form undercut regions. The undercut regions are used to accommodative conductive materials such as aluminum oxide material. For example, the conductive material is used to hold charges to stores bits. It is to be appreciated that because of the innovation afforded by the present invention to provide undercut regions, various etching processes according to the present invention are self-aligned. Among other things, the technique according to the present invention for forming twin-bit device allows further scaling down of the device in comparison of convention techniques. Furthermore, various processes and techniques can be compatible with conventional systems and equipments, thereby allow cost effective implementation. There are other benefits as well.

Various additional objects, features and advantages of the present invention can be more fully appreciated with reference to the detailed description and accompanying drawings that follow.

DETAILED DESCRIPTION OF THE INVENTION

According to embodiments of the present invention, techniques directed to manufacturing memory devices are provided. Merely by ways of example, embodiments according to the present invention provide a method and a structure for manufacturing a twin bit cell structure for a non-volatile memory device. But embodiments according to the present invention can be applied to manufacturing of other devices.

Figure 1:
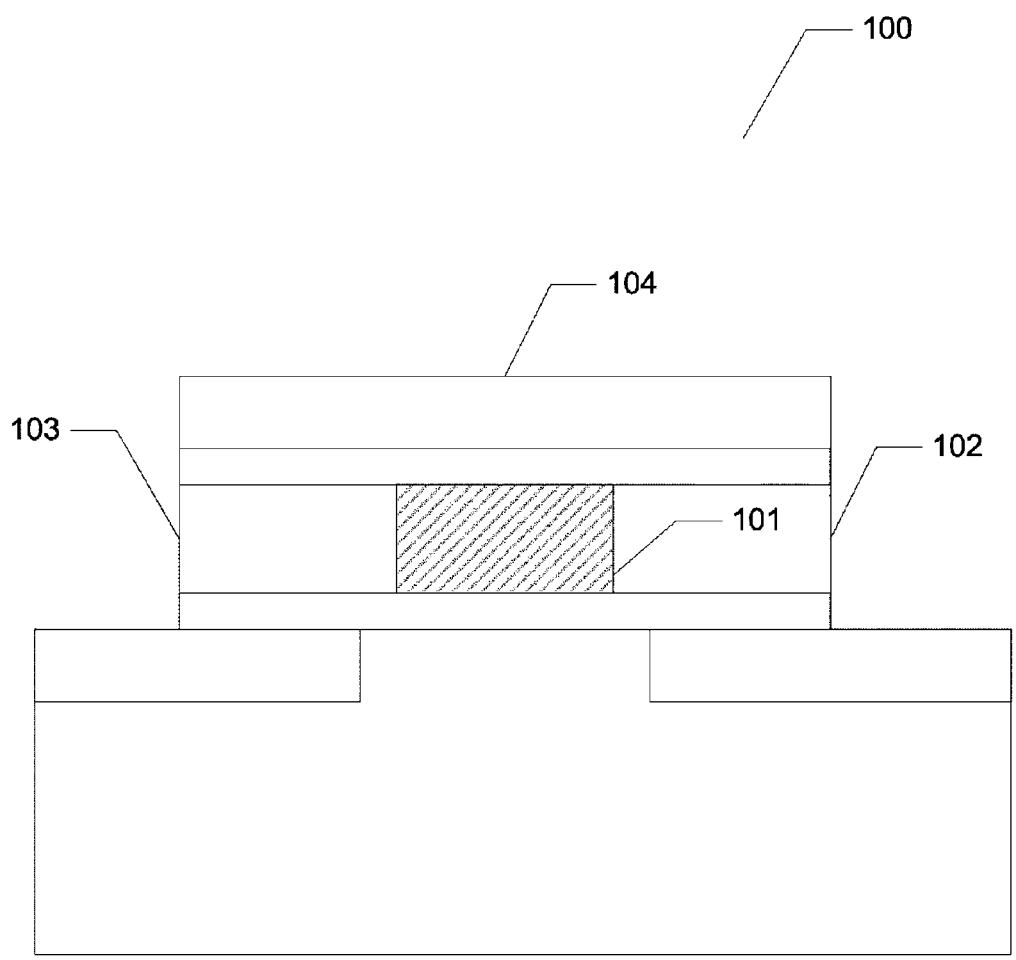
FIG. 1 is a simplified flow diagram illustrating a conventional method of forming a gate structure for a non-volatile memory device.

FIG. 1 is a simplified twin bit cell structure using a conventional method for fabrication. As shown in FIG. 1, the twin-bit structure 100 has two conductive regions 102 and 103 that can be configured to hold charges. The two conductive regions are separated by an isolation region 101. A control gate 104 overlays the conductive regions.

As an example, the twin bit cell structure shown in FIG. 1 is manufactured using the following steps:
1. provide a p-type substrate;
2. form a gate oxide layer overlaying the substrate;
3. perform low-pressure chemical vapor deposition (LPCVD) to form a n-type doped polysilicon layer;
4. perform high temperature oxidation (HTO) to anneal the doped polysilicon layer;
5. provide a layer of undoped polysilicon material;
6. perform HTO on the layer of undoped polysilicon material; and
7. form layer of n-type doped polysilicon material.

Among other things, the conventional manufacturing processes, such as the one outlined above, are difficult to achieve small scale. For example, the formation of an insulating region between the conducting layers (e.g., as provided by the n-type doped regions) is performed by an etching process that can only be scaled down so much. In addition, the use of multiple HTO processes impose a limitation on the total available thermal budget.

Therefore, it is to be appreciated that various manufacturing processes and structures as provided by the embodiments of the present invention made it possible to scale down the twin-bit cell structure sizes as compared to conventional techniques. An exemplary process is described in detail below.

Figure 2:
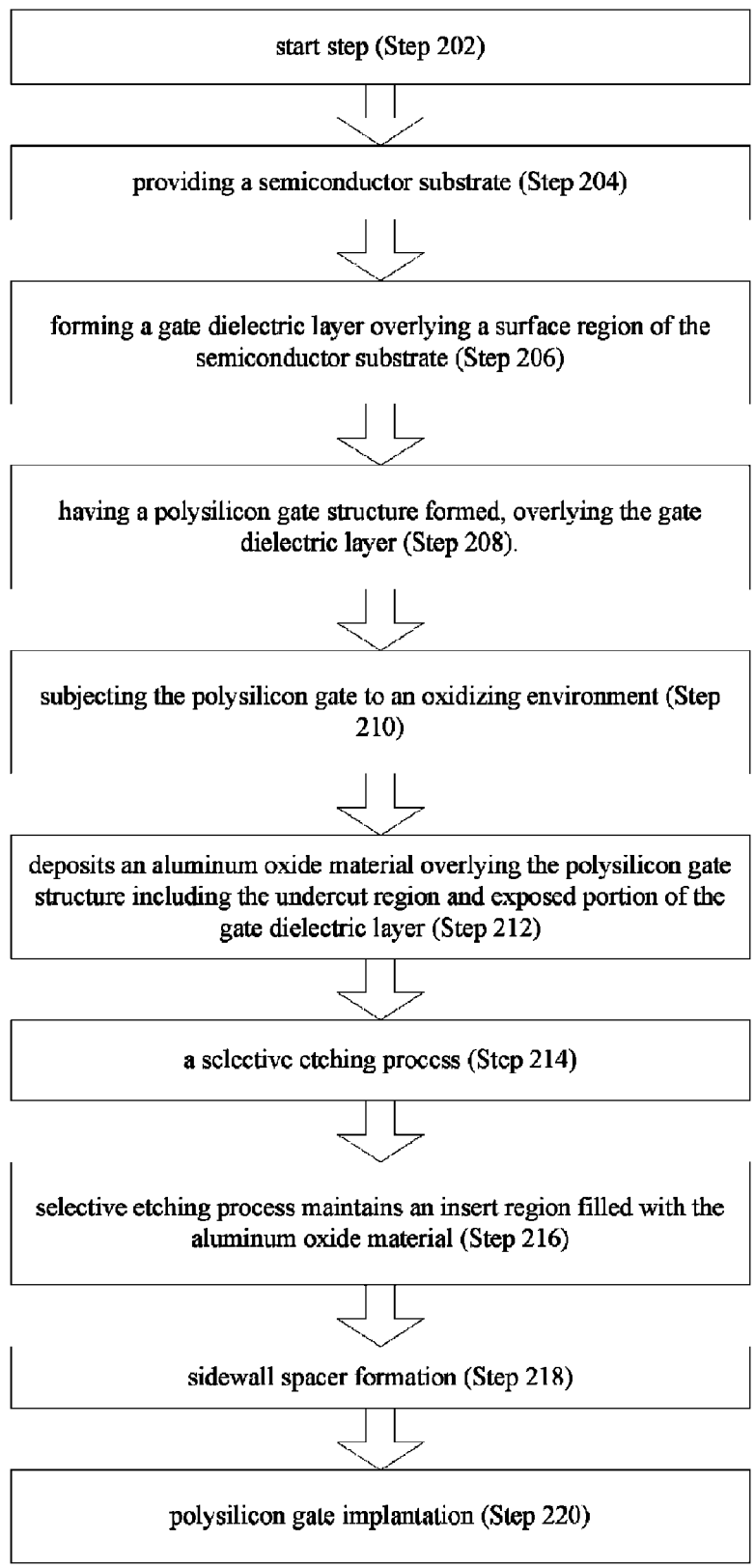
FIG. 2 is a simplified flow diagram illustrating a method of forming a gate structure for a non-volatile memory device according to an embodiment of the present invention.

FIG. 2 is a simplified flow diagram illustrating a method of forming a twin cell structure according to an embodiment of the present invention. This diagram is merely an example and should not unduly limit the claims herein. One skilled in the art would recognized other variations, modifications, and alternatives. As an example, various steps described in FIG. 2 can be added, removed, modified, replaced, repeated, rearranged, and/or overlapped.

As shown, the method has a start step (Step 202). The method includes providing a semiconductor substrate (Step 204). In a specific embodiment, the semiconductor substrate is essentially a single crystal silicon doped with a P-type impurity in a specific embodiment. Alternatively, the semiconductor substrate can be a silicon on insulator substrate, commonly known as SOI. The semiconductor substrate can also be a silicon germanium wafer or others, depending on the embodiment.

The method includes forming a gate dielectric layer overlying a surface region of the semiconductor substrate (Step 206). Depending on the application, the gate dielectric layer can formed in various ways, such as silicon oxide deposited using a suitable technique, for example, a thermal growth process. In a specific embodiment, a high temperature oxidation process is used to form a silicon oxide layer of less than 250 angstroms in thickness, which is to be used as the gate oxide layer.

The method further includes having a polysilicon gate structure formed, overlying the gate dielectric layer (Step 208). As an example, the polysilicon gate structure is formed by using a deposition process of a doped polysilicon material followed by a patterning and etch process. In a specific embodiment, an LPCVD process is used to form the polysilicon gate layer of less than 1000 angstroms. For example, silane may be used to perform LPCVD as a reactant gas.

As shown in FIG. 2, the method includes subjecting the polysilicon gate to an oxidizing environment (Step 210). In a specific embodiment, the oxidizing environment causes a silicon oxide layer to form surrounding the polysilicon gate structure and forms an undercut region in the gate dielectric layer.

The method then deposits an aluminum oxide material overlying the polysilicon gate structure including the undercut region and exposed portion of the gate dielectric layer (Step 212). In a specific embodiment, the aluminum oxide material includes a nanocrystalline silicon material sandwiched within aluminum oxide layers. The method performs a selective etching process (Step 214) to remove a portion the aluminum oxide material. In a preferred embodiment, the selective etching process maintains an insert region filled with the aluminum oxide material (Step 216). The method performs other processes to complete the cell structure. These other processes can include sidewall spacer formation (Step 218), polysilicon gate implantation (Step 220) among others. The method also includes performing other steps to complete the memory device. Of course there can be other modifications, variations, and alternatives.

FIGS. 3-11 are simplified diagrams illustrating a method for forming a twin bit cell structure for a memory device according to an embodiment of the present invention. These diagrams are merely examples and should not unduly limit the claims herein. One skilled in the art would recognized other variations, modifications, and alternatives. It is to be appreciated various steps as illustrated in these figures can be performed in various sequences, repeated, modified, rearranged, and/or overlapped.

Figure 3:
FIG. 3-11 are simplified diagrams illustrating a method of forming a gate structure for a non-volatile memory device according to an embodiment of the present invention.

As shown in FIG. 3, the method provides a semiconductor substrate 302. The semiconductor substrate can be a single crystal silicon substrate doped with a P-type impurity in a specific embodiment. Alternatively, the semiconductor substrate can be a silicon on insulator substrate, commonly known as SOI. The semiconductor substrate can also be a silicon germanium wafer or others, depending on the embodiment. As shown, the semiconductor substrate includes a surface region 304.

Figure 4:

In a specific embodiment, the method includes forming a gate dielectric layer 402 overlying the surface region of the semiconductor substrate as shown in FIG. 4. The gate dielectric layer can be a high density silicon oxide layer formed by a thermal growth process. The gate dielectric layer can also be a composite dielectric stack, for example, silicon oxide on silicon nitride on silicon oxide stack, commonly known as ONO. Other dielectric materials such as silicon nitride, silicon oxynitride, may also be used, depending on the embodiment. Taking a thermally grown oxide as the gate dielectric layer as an example, the gate dielectric can have a thickness ranging from about 20 Angstroms to about 1000 Angstroms. In a specific embodiment, high temperature oxidation process is used to form the gate dielectric layer 402 consisting mostly silicon oxide, the dielectric layer 402 having a thickness of between 50 to 1000 angstroms. Of course there can be other variations, modifications, and alternatives.

Figure 5:
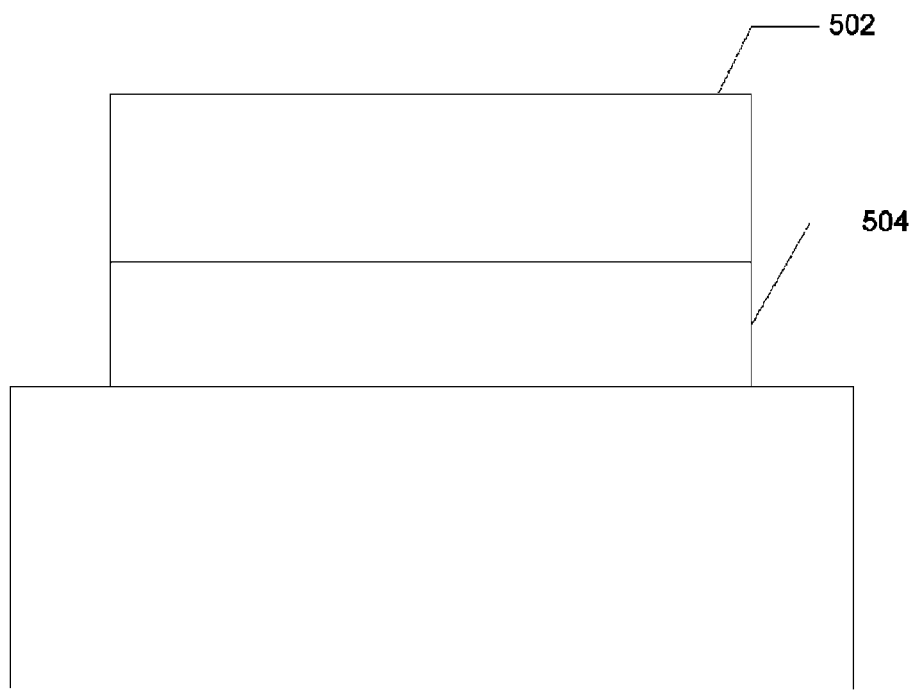

Referring to FIG. 5, the method includes forming a gate structure 502 overlying the gate dielectric layer 504. In a specific embodiment, the gate structure can be a polysilicon gate structure. The polysilicon gate structure can be formed by a deposition of a polysilicon material followed by a pattern and etch process. For example, LPCVD process is used to form the polysillicon gate structure. The polysilicon material may be doped with suitable impurities to provide for a desirable property. In a specific embodiment, the polysilicon material is doped with N-type impurities such as arsenic, phosphorus, or antimony, but can be others. For example, the doping concentration of the N-type impurities is approximately between 1.0 E 18 and 1.0 e 22 atom/cm$^3$. Depending on the specific applications, the gate structure 502 may have a thickness of between 300 to 5,000 angstroms.

Figure 6:
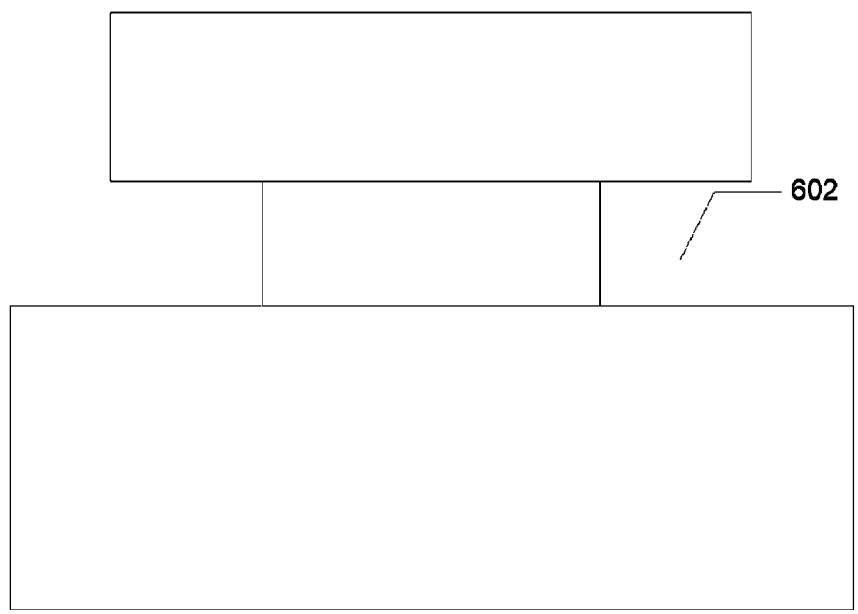

In a specific embodiment, the method forms a first undercut region 602 in a portion of the gate dielectric layer as shown in FIG. 6. The undercut region can be formed using a self-limiting etching process in a specific embodiment. For example, size of the undercut region depends at least on the thickness of the polysilicon layer. In a specific embodiment, selective etching process is performed to partially remove the gate dielectric layer, which consists primarily of silicon oxide material. For example, the selectivity of the etching process is afforded by the layers that are surrounding the polysilicon layer that is to be etched away (e.g., the gate structure and the substrate together provide alignment for the etching). The undercut region is a void region as defined by the gate dielectric thickness in a specific embodiment, as shown. It is to be appreciated that using the self-limiting etching process as described above, the need for using photoresist is removed, thus allowing for the device to scale further down compared to conventional processes.

Figure 7:
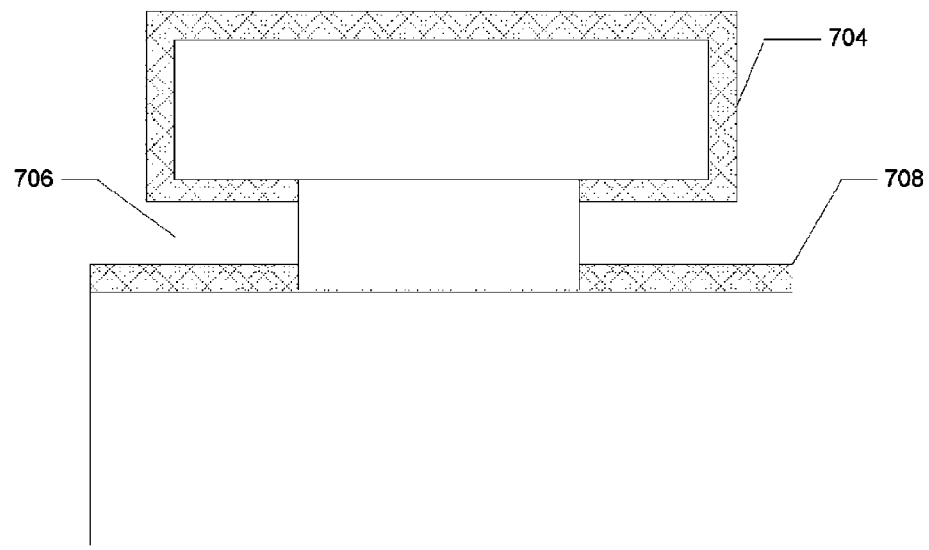

In a specific embodiment, the method includes subjecting the polysilicon gate structure to an oxidizing environment to form an oxide layer 704 as illustrated in a FIG. 7. The oxidizing environment causes a first silicon oxide layer 704 to form overlying a portion of the polysilicon gate. For example, the first silicon oxide layer 704 includes essentially oxide formed polysilicon material that is doped with N-type impurities. The oxidizing environment also causes a second undercut region 706 to form between the polysilicon gate structure and the surface of the substrate. As shown, a thin silicon oxide layer 708 is also formed overlying the surface region of the semiconductor substrate For example, the silicon oxide layer 708 consists primarily oxide formed with the doped (P-type) single silicon material. Of course there can be other variations, modifications, and alternatives.

Figure 8:
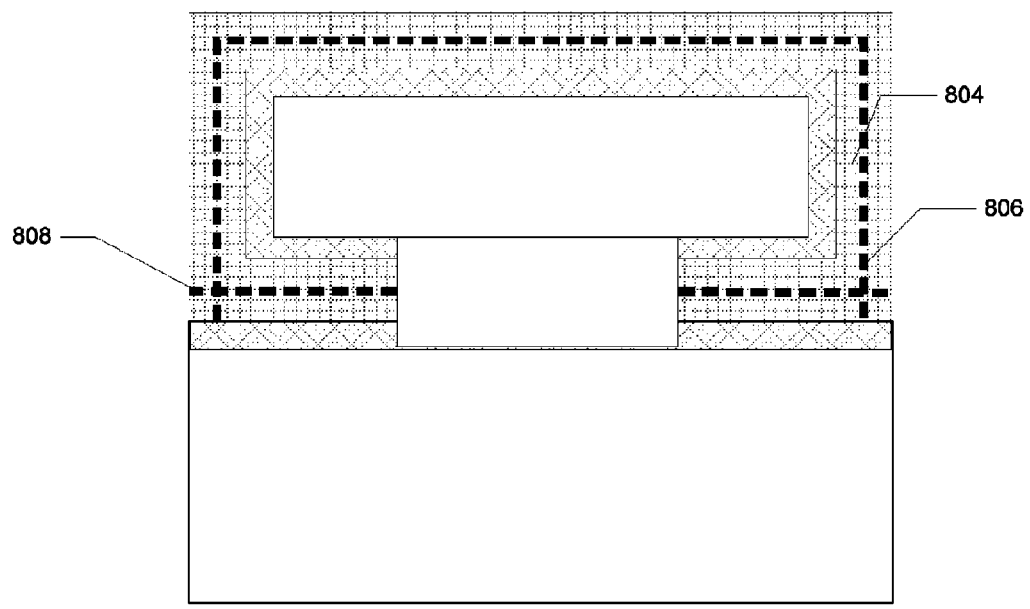

In a specific embodiment, the method includes forming a aluminum oxide material 802 overlying a peripheral region of the polysilicon gate structure, the thin oxide layer and filling the second undercut region as shown in FIG. 8. In a specific embodiment, the aluminum oxide material includes a nanocrystalline silicon material sandwiched between aluminum oxide layers. A more detailed diagram of the aluminum oxide material is also shown. The aluminum oxide material is formed by depositing a first aluminum oxide layer 804 overlying the peripheral region of the polysilicon gate structure and the thin oxide layer. Depending on the applications, various types of deposition techniques may be used. As shown, the first aluminum oxide layer 804 fills the undercut region between the gate and the substrate. As shown in FIG. 8, the embodiment of the present invention provides that the thickness of the aluminum oxide material is controlled by the thickness of the gate oxide material.

The method then deposits a nanocrystalline silicon material 806 overlying the first aluminum oxide layer. The nanocrystalline silicon material can be deposited by a chemical vapor deposition process using a silicon chloride species as precursor. The silicon chloride species can include $SiH_2Cl_2$, $SiHCl_3$, or $SiCl_4$ depending on the embodiment. In an embodiment, the nanocrystalline silicon material is preferably deposited using a low pressure chemical vapor deposition process. As merely an example, the nanocrystalline silicon material can be deposited using 1% $SiH_2Cl_2$ in argon provided at a flow rate of about 50 SCCM at a pressure of about 0.1 torr and a temperature of about 800 degrees Celsius. In a specific embodiment, for a deposition time of about 20 minutes, a thickness of about 2 to 4 nm of nanocrystalline silicon material can be formed. Depending on the application, the thickness of the nanocrystalline silicon material may have other thickness.

Thereafter, a second aluminum oxide layer 808 is deposited overlying the nanocrystalline silicon material to complete the aluminum oxide material. As mentioned above, the nanocrystalline silicon material 806 is sandwiched between the first and second aluminum oxide layers. In a specific embodiment, the first aluminum oxide layer and the second aluminum layer may be formed using an atomic layer deposition process. In a specific embodiment, the first aluminum oxide layer and the second aluminum layer can have a aluminum to oxygen ratio of about 1:1.3 to about 1:1.7. In a specific embodiment, the nanocrystalline silicon material has charge trapping surfaces to receive and store charges injected into the nanocrystalline silicon material. Of course there can be other variations, modifications, and alternatives.

Figure 9:
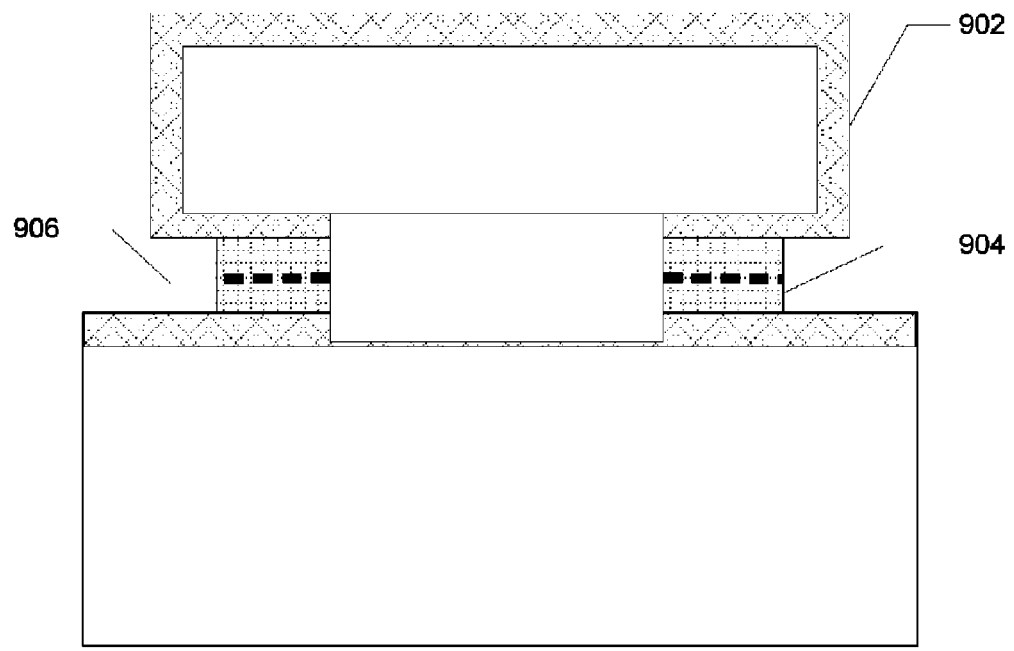

FIG. 9 is a simplified diagram exemplified an embodiment of the present invention. As shown, the method performs a selective etching process to remove a first portion of the aluminum oxide material from the gate structure while maintaining the aluminum oxide material in an insert region 904 within the undercut region. In a specific embodiment, reactive ion etching (RIE) process is used to remove a portion of the aluminum oxide material. For example, a void region 906 is formed after portions of the aluminum oxide material are removed with the RIE process. As an example, the device is placed in essentially a vacuum chamber for the etching process. As shown in FIG. 9, the structure 902 can be used to provide necessary alignment for the selective etching process. The aluminum oxide material in the insert region provides a double side structure with a twin bit function for the memory device in a specific embodiment. For example, the aluminum oxide material on each side can be adapted to hold charges, thereby each can provide a bit of memory. The aluminum material on each side is separated by a insulating layer, thereby preventing one charge from interfering with the other. Of course there can be other variations, modifications, and alternatives.

Figure 10:
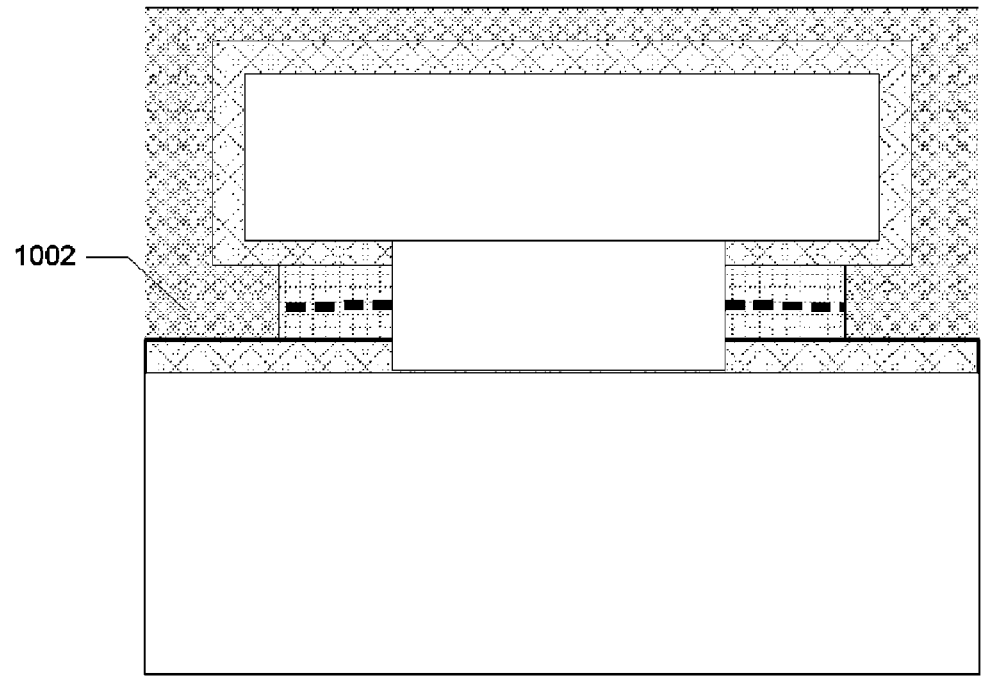

Referring to FIG. 10, the method includes forming a conformal dielectric layer 1002 overlying the polysilicon gate structure and exposed portions of the insert regions. The conformal dielectric layer may be a silicon oxide deposited using TEOS as a precursor in a specific embodiment. The conformal dielectric layer may also be a composite stack such as a silicon oxide on silicon nitride on silicon oxide (or commonly known as ONO) depending on the embodiment.

Figure 11:
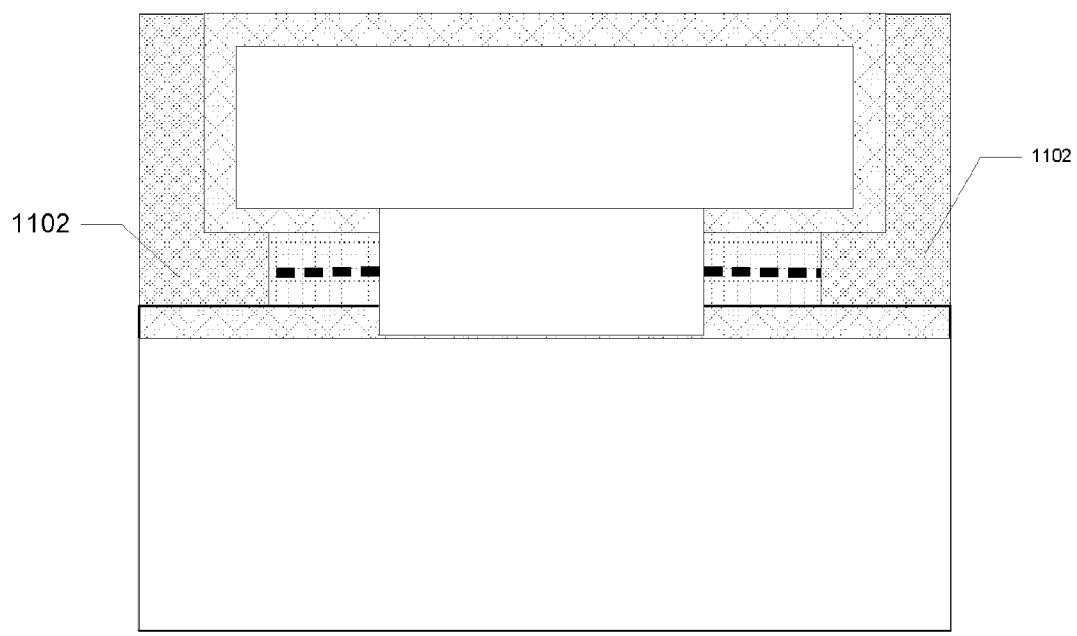

Referring to FIG. 11, the method includes performing a selective etching process to remove the a portion of the dielectric layer 1002, thus forming sidewall spacer structures 1102 exposing the top portion of the polysilicon gate structure. The sidewall spacer structures 1102 is used to insulate the sides of the polysilicon gate structure and exposed portions of aluminum oxide material in the insert regions. The sidewall spacer structure isolate and protect the polysilicon gate structure in a specific embodiment.

It is to be appreciated that various steps and structures associated with the processed described above can be modified, added, removed, repeated, replaced, and/or overlapped. In a specific embodiment, an implantation process is performed to introduce As into an active region of the device. For example, As can be used to function as N-type dopant.

Figure 12:
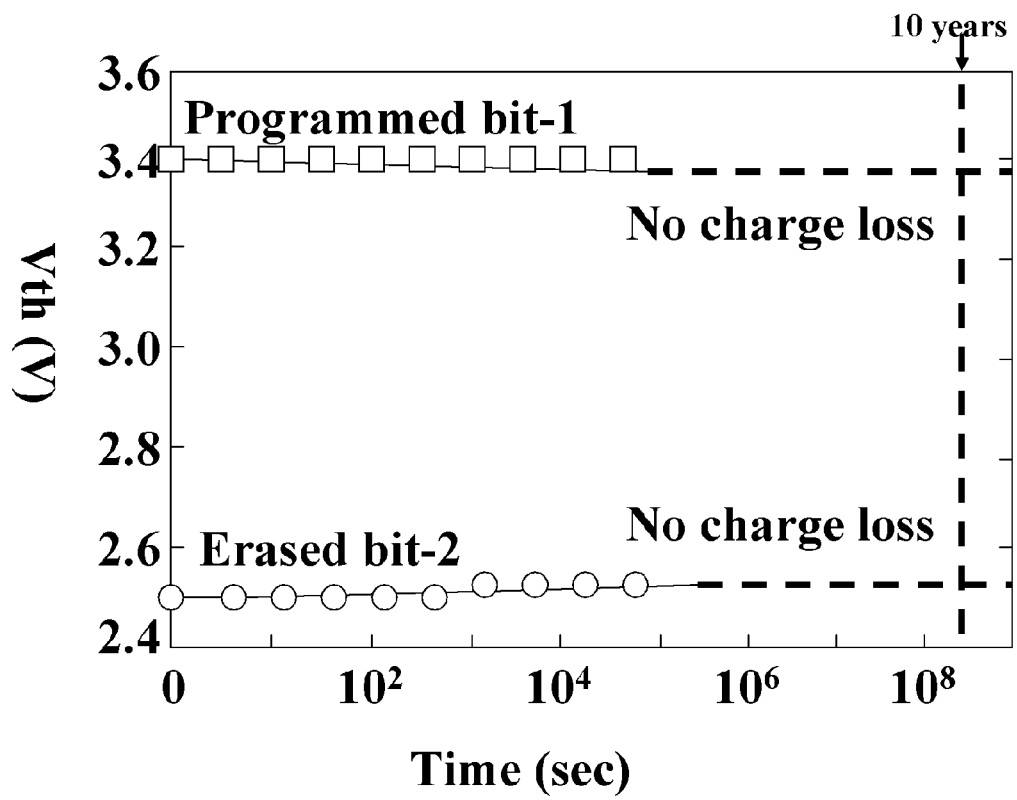
FIG. 12 is a simplified plot illustrating performance of the non-volatile memory device according to an embodiment of the present invention.

FIG. 12 is a simplified plot illustrating a retention characteristics of the twin bit memory device using aluminum oxide material according to an embodiment of the present invention. This plot is merely an example and should not unduly limit the claims herein. One skilled in the art would recognize other variations, modifications, and alternatives. As shown, a plot of threshold voltage (Vth) as a function of time is provided. The threshold voltage of a programmed bit is maintained at about 3.4 volt with no charge loss over a period of $10^8$ seconds. The threshold voltage of an erased bit 1204 is also maintained at a value of about 2.5 volts with no charge loss over the time period. The respective threshold voltages are measured at Vg=Vd=Vs=Vb=0. Of course there can be other modifications, variations, and alternatives.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for forming a non-volatile memory structure, the method comprising:
   providing a semiconductor substrate including a surface region;
   forming a gate dielectric layer overlying the surface region;
   forming a polysilicon gate structure overlying the gate dielectric layer;
   forming an undercut region underneath the polysilicon gate structure in a portion of the gate dielectric layer;
   subjecting the polysilicon gate structure to an oxidizing environment to cause formation of a first silicon oxide layer overlying a periphery of the polysilicon gate structure;
   forming an aluminum oxide material overlying the polysilicon gate structure filling the undercut region, the aluminum oxide material being formed by depositing a first aluminum oxide layer overlying the first silicon oxide layer, depositing a nanocrystalline silicon material overlying the first aluminum oxide layer and depositing a second aluminum oxide layer overlying the nanocrystalline silicon material;
   subjecting the aluminum oxide material to a selective etching process while maintaining the aluminum oxide material in an insert region in a portion of the undercut region; and
   forming a sidewall spacer structure overlying a side region of the polysilicon gate structure.

2. The method of claim 1 further comprising forming a source region and a drain region.

3. The method of claim 1 wherein the sidewall spacer structure is formed by depositing a conformal dielectric layer overlying the polysilicon gate structure followed by a selective etching process.

4. The method of claim 1 wherein the semiconductor substrate is a P-type silicon wafer.

5. The method of claim 1 wherein the undercut region is formed using a self-limiting etching process.

6. The method of claim 1 wherein the undercut region is a void region.

7. The method of claim 1 wherein the nanocrystalline silicon has an outer surface, the outer surface being capable of accumulating electrical charge.

8. The method of claim 1 wherein the aluminum oxide material is a high k dielectric material.

9. The method of claim 1 wherein the first aluminum oxide layer and the second aluminum oxide layer are formed using atomic layer deposition.

10. The method of claim 9 wherein the first aluminum oxide layer and the second aluminum oxide layer each has an aluminum to oxygen ratio of about 1:1.3 to about 1:1.7.

11. The method of claim 1 wherein the insert region provides a double-sided bit structure.

12. The method of claim 1 wherein the nanocrystalline silicon material has a thickness ranging from about 2 nm to about 4 nm.

13. The method of claim 1 wherein the aluminum oxide material is characterized by a first thickness, the first thickness being controlled by a thickness of the gate dielectric layer.

14. The method of claim 1 further comprises forming active regions in a vicinity of the surface region of the semiconductor substrate.

15. The method of claim 14 wherein the active regions are formed by an implantation process using an N type arsenic as an impurity species and the polysilicon gate structure, including the sidewall spacer structure as a mask.

16. The method of claim 1 wherein the selective etching process comprises a reactive ion etching process.

17. The method of claim 1 further comprising forming a void region adjacent to the aluminum oxide material in the insert region.

* * * * *